United States Patent [19]

Mulé et al.

[11] Patent Number: 4,754,852

[45] Date of Patent: Jul. 5, 1988

[54] SIMULATED ROCK SPEAKER ASSEMBLY

[76] Inventors: Anthony F. Mulé, 708 Meadow Rd., Smithtown, N.Y. 11787; Bruce R. Marcel, 43 Harbor North, Amityville, N.Y. 11701

[21] Appl. No.: 29,107

[22] Filed: Mar. 23, 1987

[51] Int. Cl.[4] .............................................. H05K 5/00

[52] U.S. Cl. .................................... 181/149; 181/144; 181/148; 181/175; 181/199

[58] Field of Search ............... 181/144, 148, 149, 175, 181/198, 199, 147

[56] References Cited

U.S. PATENT DOCUMENTS

| | | | |
|---|---|---|---|
| 1,687,293 | 10/1928 | Hanley | 181/141 |
| 1,707,686 | 4/1929 | Seer | 181/141 |
| 1,866,913 | 7/1932 | Stenger | 181/156 |
| 3,026,956 | 3/1962 | Wilber | 181/153 |
| 3,256,953 | 6/1966 | Rimi | 181/155 |
| 3,750,838 | 8/1973 | Pyle, Jr. | 181/153 |
| 4,082,159 | 4/1978 | Petty | 181/156 |
| 4,219,099 | 8/1980 | Sacks | 181/156 X |

*Primary Examiner*—B. R. Fuller

*Attorney, Agent, or Firm*—Sughrue, Mion, Zinn, Macpeak and Seas

[57] ABSTRACT

A simulated rock speaker cabinet in the form of a natural rock has build-up portions of modeling clay which include a pattern of small diameter holes to form speaker grills at longitudinally spaced positions. A chicken wire ring provides structural reinforcement to the speaker cabinet. The artificial rock cabinet may be molded of various hydrolitic cements, magnesite cement, a suitable catalytic plastic resin to which pigment or other colorants may be added along with glass or rock chips, to provide the simulated rock cabinet with an external appearance which corresponds to various natural rocks. The speaker cabinet has speakers and the various electronic components of the speaker system housed within the speaker cabinet and may be coated with water-proofing and weather-proofing material with the speakers molded into the wells and facing the grills. An end plug may be adhesively sealed to the opening within the base of the speaker cabinet and suitably sealed by Hydrostone or other cementous material.

10 Claims, 1 Drawing Sheet

FIG. 1
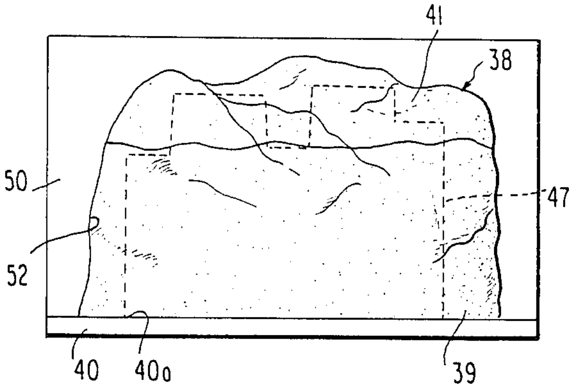
FIG. 2
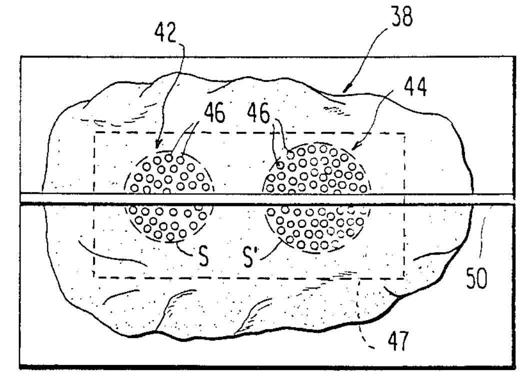
FIG. 3
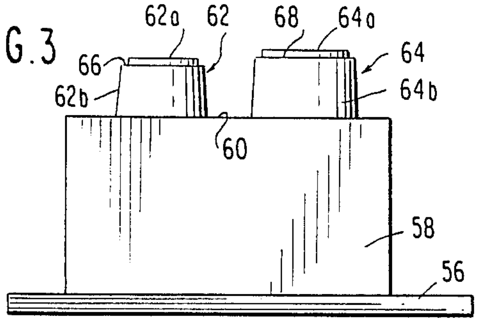
FIG. 4
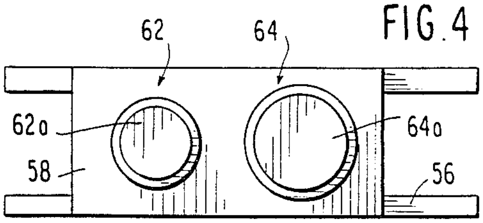
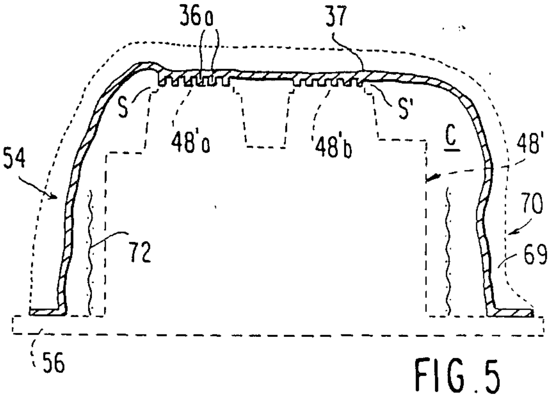
FIG. 5
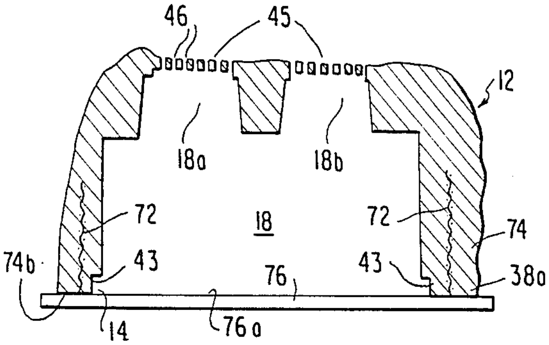
FIG. 6
FIG. 7
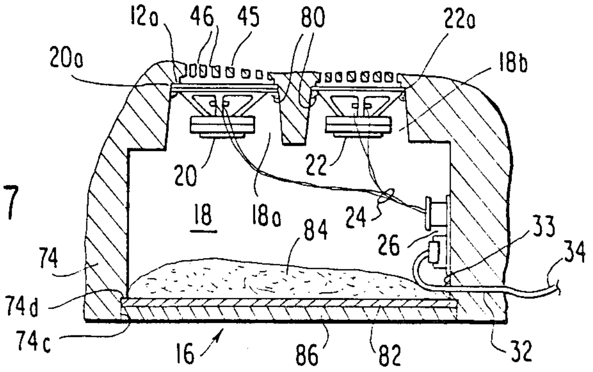

SIMULATED ROCK SPEAKER ASSEMBLY

FIELD OF THE INVENTION

This invention relates to an outdoor cabinet for housing audio speakers, transducers, receivers and related electronics and more particularly to a simulated rock cabinet and speaker system assembly and its method of manufacture.

BACKGROUND OF THE INVENTION

Most audio system speakers are incapable of extended outdoor use and are neither waterproof, nor, aesthetically speaking, do they blend with the outdoor landscaping of the area of use.

Attempts have been made to create a simulated speaker enclosure or, to create an outdoor speaker per se capable of withstanding adverse weather such as rain or snow and permitting the outdoor speaker to be used under conditions of both high temperature and low temperature. Such attempts have included integrating the audio system speaker or cabinet into simulated components of the landscaping, existing outdoor structures as well as weatherproofing both the speaker components and the speaker cabinet housing those components. Representative patents directed to such attempts are as follows:

| | | |
|---|---|---|
| 1,687,293 | J. W. H. Hanley<br>RADIO LOUD SPEAKER | October 9, 1928 |
| 1,707,686 | R. H. Seer<br>COMBINATION RADIO SPEAKER AND ELECTRIC LIGHT FIXTURE | April 2, 1929 |
| 1,866,913 | W. C. Stenger<br>SOUND DELIVERY CONSTRUCTION | July 12, 1932 |
| 3,026,956 | H. L. Wilber<br>DETACHABLE SPHERICAL LOUDSPEAKER ENCLOSURE | March 27, 1962 |
| 3,256,953 | J. J. Rimi<br>MUSICAL FLOWER POT | June 21, 1966 |
| 3,750,838 | John David Pyle. Jr.<br>CONCRETE RESONANT CONE SPEAKER SYSTEM | August 7, 1973 |
| 4,063,387 | Thomas R. Mitchell<br>HANGING PLANTER POT SPEAKER ENCLOSURE | December 20, 1977 |
| 4,082,159 | Frank Petty<br>CERAMIC SPEAKER ENCLOSURE | April 4, 1978 |
| 4,109,983 | Shouzo Kinoshita<br>SPEAKER CABINET | August 29, 1978 |
| 4,219,099 | Bernard Sacks<br>ACOUSTIC REPRODUCTION TRANSDUCER ENCLOSURE | August 26, 1980 |

While such speakers and speaker enclosures have satisfied certain needs, they have not satisfied all and the speaker cabinets or enclosures neither blend into the landscaping, nor are the speaker system assemblies including the cabinet or enclosure capable of withstanding adverse weather while at the same time insuring that the audio characteristics of the speakers are not adversely affected by the structural make-up and form of the speaker enclosure or cabinet.

It is therefore a primary object of the present invention to provide an improved, speaker assembly and its method of manufacture which is adaptable to a variety of molds and mold making processes, which creates a speaker enclosure or cabinet simulating a natural rock or stone, which cabinet or enclosure is adapted to the electronics components for a variety of speaker systems, and which may readily mount, via preformed apertures, speakers, television cameras, alarm systems, intruder repelling devices (field generators) or the like and in which, the speaker enclosure is environmentally decorative.

BRIEF DESCRIPTION OF THE DRAWINGS

FIG. 1 is an elevational view of a preformed model of a simulated rock cabinet for housing the speaker component and used in forming the simulated stone speaker assembly of the present invention.

FIG. 2 is a top plan view of the model of FIG. 1.

FIG. 3 is a longitudinal, elevational view of an insert model employed in the manufacture a male mold for the simulated rock cabinet forming the major component of the speaker assembly of the present invention.

FIG. 4 is a top plan view of the insert model of FIG. 3.

FIG. 5 is a longitudinal, sectional view of a mold assembly using a molded plastic male model, the insert model of FIGS. 4 and 5, and a rubber, female mold formed directly on the model of FIGS. 1 and 2, and an outer jacket for supporting the rubber, inner mold, and the male mold insert, after inserting the assembly shown.

FIG. 6 is a vertical, longitudinal sectional view of the molded speaker cabinet after removal from the model assembly of FIG. 5.

FIG. 7 is a longitudinal vertical sectional view of a molded, simulated rock speaker cabinet assembly having an exterior configuration essentially identical to that as shown in the models of FIGS. 1, 2 and 3, forming a preferred embodiment of the invention, and manufactured in accordance with the method of the present invention.

DESCRIPTION OF THE PREFERRED EMBODIMENT

Referring to the drawings, FIGS. 1–6 inclusive show in step fashion the method of manufacture of the simulated rock cabinet or enclosure 12 which is the principle component of the speaker assembly 10 of FIG. 7.

FIG. 7 therefore constitutes a preferred embodiment of the simulated rock speaker assembly 10 and consisting primarily of the molded, hollow simulated stone speaker cabinet or enclosure 12, having an opening 14 at the bottom of the cabinet or enclosure 12 closed by a formed cap or plug 16. The hollow cabinet 12 is formed with a relatively large cavity or chamber 18 which is characterized by longitudinally spaced, generally vertical cylindrical speaker wells **18*a* and 18*b* within which a first speaker 20 and a second speaker 22, are respectively mounted. The speakers are connected by leads 24 to a lower component or crossover 26. The internal leads 24 connect component 26 to respective speakes 20, 22. The content and structural make-up of the simulated stone speaker assembly 10 will be discussed in greater detail hereinafter. Initially, however, the method of manufacture of the speaker cabinet or enclosure 12 will be described in conjunction with the sequence illustrated in FIGS. 1–6** inclusive.

The initial step is to prepare a rubber female mold indicated generally at 36, FIG. 6. In the mold preparation a series of steps are taken in sequence. First, a model indicated generally at 38, of FIGS. 1, 2 and 3, which may be a natural stone or rock 39, is taken and mounted on a flat surface 40a of a board 40. Board 40 is employed so that registration of the speaker hole area 42, 44 are all on the a common plane. The areas where the speakers 20, 22 of assembly 10 are to be mounted are molded in plastering clay 41 to match the surface of the rock being used, FIG. 1 with a plurality of small diameter vertical holes 46 drilled into the clay 41. After the modeling of the speaker apertures 46 and filling and modeling of under-cuts 93 in the base 38a of the mold, the whole piece 38 is coated on its exterior with shellac and allowed to dry. As may be seen from FIGS. 1 and 2 it is subsequently necessary in using the finished female rubber inner mold 36, to employ a special male mold insert indicated generally at 48 in dotted lines, FIG. 6 to create a negative space 18 (hollow) in the interior of the molded speaker cabinet or enclosure 12. The insert 48 is customized to each layout since each rock to be simulated is different and, the insert must therefore register with the molding of drill holes on outside of the rubber, female inner mold 36. The outline that the male mold insert model 48 and the insert 48' itself must take is shown in dotted lines at 47 in FIGS. 1 and 2.

The enclosure model 38, after being coated over its complete surface which shellac which is allowed to dry, is then carefully coated with 25 coats of molding rubber 37. The molding rubber may be Cemetex #83, a molding rubber manufactured by the Cementex Latex Company under that trade designation. In coating the shellac covered model 38 with multiple coats of rubber, it is necessary to allow each coat to dry prior to applying the succeeding coat. After some 25 coats of molding rubber are applied, the model 38 coated with molding rubber 37 is vulcanized under 140° F. for approximately 12 hours to cure the rubber.

A cardboard divider 50 is provided with an interior cut-out 52 configured to the exterior surface of the rubber mold 36 while on model 38. The divider 50 is shown in FIGS. 1 and 2 as extending longitudinally and centered transversely on model 38 although more accurately, it is centered on the model 38 after the application of the coats of molding rubber and vulcanization of the same to create the rubber inner mold 36. The function of the cardboard divider 50 is to permit the creation of a rigid supporting jacket indicated generally at 54, FIG. 6 (one half of which is seen as applied to the exterior of the rubber inner mold 36 and conforming to the configuration of the same). By using a cardboard divider 50, the rigid supporting jacket 34 is formed as two mating jacket halves permitting jacket 34 to be removed and applied exteriorly to the rubber inner mold 36 in forming mold assembly 70, FIG. 5. Prior to the manufacture of the rigid supporting jacket 54, the model 38 bearing the vulcanized rubber inner mold 36 along with the divider 50 are coated with lacquer and allowed to dry.

To form the rigid supporting jacket, strips of burlap 69 are soaked in wet plastic of Paris and applied to each half of the lacquer coated rubber inner mold 36. This is effected to each half of the mold to create removable jacket 54 formed of edge matching halves. After the plaster of Paris sets and dries, the halves of jacket 54 are removed and the rubber inner mold 36 is removed from model 38. The model 38 is no longer used in the manufacture process but of course, the discarded model may be employed later in the same or modified form by selective use of plastering clay 41. The rubber inner mold 36 is then placed inside the jacket 54 whose sections are maintained closed by a rope or cable (not shown) surrounding the two halves of the jacket 54 in forming mold assembly 70.

The second major step in the manufacture of the simulated stone speaker cabinet or enclosure is the formation of insert model 48, FIGS. 4 and 5. The special insert model 48 is so constructed as to forming, preferably by plastic reproduction, a male mold insert 48', permit to create the hollow cavity or negative space 18 within the interior of the molded cabinet 12 during speaker cabinet molding. The mold 48, and thus the male molde insert 48' insert requires registering with the molding of grille holes on the exterior of the rubber inner mold 36 as the finished rubber inner mold is turned over borne by the jacket 54 so that its interior is revealed.

As stated previously since each rock to be simulated is different, each insert model 48 must be customized to the desired speaker lay-out. In the illustrated embodiment, two speakers 20, 22 are shown, positioned generally in line longitudinally and vertical offset within the simulated stone cabinet or enclosure 12. The insert model 48 may be formed of wood including a pair of runners or beams 56, upon which a rectangular wooden base block 58 is mounted, spanning a given width, with the beams 56 extending along opposite sides and being attached to the block 58 by nails, screws, or the like. The block 58 is provided with a flat top or upper surface 60 upon which mounts, in vertically upright position, a pair of laterally centered and longitudinally spaced frusto-conical speaker well defining blocks 62, 64, Block 64 is slightly higher than that of block 62 and also being slightly larger diameter, FIG. 4. Annular recesses are provided at 66, 68 within respective blocks 62, 64 to form reduced diameter portions 62a, 64a, respectively which project slightly above the base portions 62b, 64b of these blocks. The insert model 48 is formed of wood with tubular projections formed by blocks 62, 64 functioning as tools sized to the speakers 20, 22 to be used in forming the simulated stone speaker assembly 10. The insert model 48 permits the creation of an internal male mold member cooperating with the rubber inner, female mold 36 to facilitate casting of the simulated stone cabinet or enclosure 12 which directly mounts the speakers 20, 22 interiorly within speaker wells 18a, 18b, FIG. 7. The insert model 48 is finished to a high sheen and preferably reproduced in plastic as the male mold insert 48' by conventional plastic molding. The actual insert 48', used in the mold assembly 70 of FIG. 6, is of plastic and sized and configured identically to match the insert model 48, FIGS. 3 and 4. This insures that the plastic the molded plastic insert 48' can be removed from cast body 74, FIG. 6, since, preferably the simulated stone cabinet or enclosure 12 is made from a Hydrolytic material. The insert model 48 and the plastic reproduction insert 48', functioning as the male mold of assembly 70 creates the internal space or cavity 18 within the finished molded simulated stone speaker cabinet or enclosure 12. Model 48 is so designed as to form mountings for any size or shape electronic component to fitted internally within the simulated stone outer enclosure. Such electronics may constitute telemetry, alarms, and the like in lieu of the speakers 20, 22, FIG. 7.

Casting of the simulated stone speaker cabinet 12 is achieved using mold assembly 70 as set up in FIG. 6. The molded plastic insert 48' may be positioned in the upright position as shown. The rubber, inner female mold 36 is dropped into place onto and overlying the insert mold 48' such that the small diameter circular projections 36a of the rubber mold 36 contact the flat tops of the frusto-conicol projections 48'a, 48'b of the plastic insert forming the male mold 48' while, the horizontal rim 36b of the rubber inner mold 36 contacts beam portions 56' of the plastic insert mold 48' of the assembly of FIG. 6. As may be appreciated, the halves of rigid supporting jacket 54 are then fitted snugly about the exterior surface of the rubber inner mold 36 and, upon completion of the mold assembly 70 FIG. 6, the assembly 70 is inverted prior to filling of mold cavity C between the plastic insert 48' forming the male mold of assembly 70 and the rubber, inner female mold 36 which closely conforms to the interior surface of the rigid supporting jacket halves making up jacket 54.

Various casting mxtures may be employed in the formation of the molded simulated stone speaker cabinet or enclosure 12. Cementious mixture may be made of various Hydrolytic cements i.e.; Hydrostone, Portland Cement mixed with water and fiber glass binder and alkali proof mineral stains may be mixed with water, with the mixtures poured into the upended assembly 70, of FIG. 6 and allowed to set. Hydrostone is a hydraulic cement manufactured by the United States Gypsum Corporation under that trade designation. The pigmentation of the simulated stone may be achieved by use of color batch mixtures poured into the mold cavity C and allowed to mix. Further, a dusting of the inside of the rubber inner mold 36 with mica, glass, etc., may be effected or by adding mica, glass, etc. in with the batch of the Hydrolytic cement. Various surface effects can be given to the cast body 74.

Typical pigments include black oxide of iron for black pigmentation if desired, for ultramarine, pure and artificial red oxide of mars colors, cobalt blue; for browns, umbers, sienna's -yellow ochre, Raw sienna, mars yellow, iron oxide; for greens, chromium oxide and viridian; and for white, white cement with mineral additions of zinc and titanium oxide, marble dust, etc. Additionally, any synthetic acid and alkali proof dyes or additives may be employed. The concrete mixture may include color additive up to 10% of its volume and the colors are mixed first with water to create a slurry and then added to the batch of Hydrolytic cement. In the casting of cementious materials, such as that just previously described, Hydrostone constitutes a high grade gypsum cement used primarily for high quality statuary casting. Hydrostone has the strength of approximately 10,000 to 13,000 pounds per square inch and is ideal for a RK-1000 cabinet 12.

With the rubber forming inner mold 36 within jacket 54, the mold assembly 70 is set up on a flat surface, inverted from the position shown in FIG. 6. The plastic molded insert 48' is then positioned within the rubber inner mold 36 with the insert 48' registered correctly on the grilles 36a. Preferably the insert 48' is lubricated with a heavy paste oil lubricant such as a hydrogenated oil prior to positioning the insert internally within the rubber inner mold 36. The insert 48' is locked in place either with weights or clamps (not shown). A ring of chicken wire 72 is preferably positioned around the insert 48', within cavity C for reinforcement of the cost material and spaced from both models 49' and 36. The Hydrostone may be mixed in the ratio of 35 pounds of water to 100 pounds of Hydrostone or 1-3 by weight. Each speaker cabinet or enclosure 12 requires different volumes due to the change in shape and size so there is no standard in total mass and only the water/cement mixture ratio need be kept constant. Preferably, the Hydrostone mixture is mixed in sufficient quantities for a single cast and divided into two or three parts with each part receiving a desired amount of a premixed color as an additive, with some color change. The color additives are mixed with three different volumes of the Hydrostone mixture and all three batches of color added Hydrostone mix is poured into the mold cavity C between the rubber inner mold 36 and the plastic insert 48' and about that insert, at varying rates and volumes to achieve different coloration effects and swirls. All colored slurries from the original batch diffuse into one mass speaker enclosure or cabinet forming body 74, FIG. 6. The chicken wire 72 acts as a reinforcement to prevent cracking under shock. After the Hydrostone mixture material of body 74 sets, which takes about 17 minutes, the plastic insert 74' is removed.

The insert 48' can be pulled from the upwardly open mold. Thereafter, the molded material body 74 bearing externally the rubber inner mold 36 and the jacket 54 may be inverted and placed in the position shown in FIG. 6, that is with the speaker cabinet body 74 repositioned in its normal upright position on the flat surface 76a of an underlying support disk 76. In this position, the jacket 54 may be removed from the rubber inner mold 36 and the rubber inner mold 36 pulled from the molded speaker cabinet body 74. The cast body 74 is then dried in a heated drying room for 12 hours at 120° and the speaker body 74 is then finished by tooling. In this step, the grille holes 46 are drilled through after having been partially formed during casting by way of the projections 36a formed within the rubber inner mold 36 in the two circular arrays S and S', FIG. 2 corresponding to respective speakers 20, 22, FIG. 7. Additionally, during the step of finishing and tooling, seams (not shown) created by the junction between the two jacket sections for jacket 54 and the base 74a of the speaker body 74 are trimmed to provide a flatten bottom surface 74b and a circular recess 74c thus creating a shoulder 74d against which rests the top of the separately formed plug or cap 16 closing off the interior 18 of the speaker cabinet 12. Under these conditions the speaker cabinet or enclosure 12 is ready for mounting of the electronics.

It should be noted that the casting procedure is basic to all casting materials using alternative materials such as magnesite cement, or acrylic. In the magnesite cement method, variously called plastic magnesia, calcite magnesite, caustic magnesite and lite burned magnesite may be employed. A mixture is made, for example, by mixing a calcite magnesite with liquid magnesium chloride in addition to cement colors and glass and marble chips (and or other inert material). This provides a finished, molded appearance which is marble like and translucent and is employed in the duplication of igneous and metamorphic stone.

The imitation stone or rock speaker cabinet 12 may also be cast from any catalytic plastic resin by employing the above mentioned inert colorants and materials to achieve a stone like material.

After drawing the cast speaker enclosure body 74 from the mold 70, it may be necessary to provide a surface coating which is waterproof. Since the magnesite and plastic material is inherently waterproof, no additional treatment is necessary. However, when the mass of the cast material body 74 is of Hydrolytic cement or gypsum cement, it is necessary to provide such waterproof coating. A silicon ester coating may be applied by spraying the exterior surface of cast body 74 or the like to make that exterior waterproof. The coating preferably employed is a UCAR silicate ESP-E a product of the Union Carbide Corporation. This product is a silicon ester of ethyl silicate polymers that bonds chemically with gypsum to consolidate with a porous cementious surface. After the cast body 74 is trimmed and dried, it may be sprayed with UCAR ESP-E and cured at 140° F. for 2 hours. It is this spray coating which helps prevent the speaker cabinet 12 from deteriorating under adverse weather conditions and is a key aspect of the manufacturing process. To complete the speaker system using the cast speaker cabinet 12, it is required that the speakers be mounted internally within chamber or cavity 18, FIG. 7, and suitably connected to equipment within chamber 18 in addition to the speakers 20, 22 by way of the access hole 14 within the bottom of the cast speaker cabinet 12.

Typically, the electronics may constitute a three-way speaker system consisting of an eight inch polypropylene woofer, rated 100 watts at 8 ohms, a four inch closed back polypropylene mid-range speaker rated 70 watts at 8 ohms and a piezoelectric tweeter rated 70 watts at 8 ohms. In addition, there is a three-way passive cross-over 26 custom made 1.5 wire wound cooper coil with the electronic components being appropriately electrically connected internally of the cabinet 12 via electrical leads or wires 24. These wires may be of polyvinyl coated 32 wire per strand copper wire.

The speakers, 20, 22, are coated on sponge surrounds and other water permeable parts with Waldrom AA-75 speaker cement a product of the Waldron Electric Corporation. This speaker cement is made of polyvinyl chloride with aromatic ketons as solvents. As seen from FIG. 7, the speakers 20, 22 are mounted using a silicon cement gasket 78 between the speakers 20, 22 and the speaker grills 45. This operation is best performed with the cabinet 12 positioned upside down. With the speakers in position, and with the rims 20*a*, 22*a*, respectively, of speakers 20, 22, in contact with shoulder 12*a* of the cylindrical speaker wells 18*a*, 18*b*, respectively, Hydrostone material is poured over the rims 20*a*, 22*a* of respective speakers and allowed to dry forming Hydrostone gaskets 80, integrally locking the speakers 20, 22 in place in the speaker wells 18*a*, 18*b*. Additionally, gaskets 80 make an air tight seal between the rims 20*a*, 22*a*, of the speakers and the speaker cabinet 12, thereby eliminating vibration. Cross-over 26 is mounted on the interior wall 30 of cabinet 12 with silicone cement or the like. An exterior cable 34 is passed through a hole 32 drilled within body 74, into the cavity 18. The hole 32 is sealed with silicone 33 after the speakers 20, 22 and cross-over 26 are wired up. Preferably, prior to the installation of plug or cap 16, the entire inside of the speaker cabinet with the equipment in place is sprayed with automotive undercoat and allowed to dry. The plug 16 is constituted by a disk 82 formed of wood or other appropriate sheet material sized to fill the opening 14 and to rest against shoulder 74*d* at its periphery. Further, the plug 16 has a layer of fiberglass installation 84 attached to the upper surface 82*a* of the disk 82 and the plug 16 may be secured within the opening 14 of the speaker cabinet 12 by silicone glue. After the glue is set, preferably a thin layer 86 of Hydrostone is poured into the slightly recessed area within the base 74*b*, overlying the disk 82. When the Hydrostone layer 86 sets, the speaker system 10 is complete and the unit is ready for sustained outdoor use, providing high fidelity sound reproduction, under extreme weather conditions.

What is claimed is:

1. A water-proof, simulated rock speaker cabinet comprising:

a cast hollow simulated rock cabinet body of inverted U-shaped cross-section having a base portion with an opening therein and forming interiorly a resonant chamber, said cast hollow body having an irregular outer surface simulating the configuration of a natural rock, a plurality of speaker mounting wells formed within said cast hollow body and extending from said chamber into said cast body and terminating short of said irregular outer surface, a pattern of small diameter holes within said cast hollow body aligned with said wells, speakers mounted respectively within said speaker wells to form speaker guides facing said pattern of small diameter hole, and a plug sized to said opening within said cast body base and closing off said opening, a hole within said body, an electrical lead connected to said speakers and extending through said hole and means sealing said electrical lead within said hole.

2. The simulated rock speaker cabinet as claimed in claim 1 wherein said body is formed of a hydrolitic cement including pigment to provide a texture and color simulating that of a natural rock.

3. The speaker cabinet as claimed in claim 1, wherein said hollow cast body is formed of one material from the group consisting of plastic magnesium, calcite magnesite, caustic magnesite and lite burned magnesite.

4. The simulated rock speaker cabinet as claimed in claim 3, wherein said cast body further comprises a pigment and glass and marble chips such that the cast body is marble-like and translucent to duplicate igneous and metamorphic rock.

5. The simulated rock speaker cabinet as claimed in claim 1, wherein said cast hollow body is formed of plastic resin and a pigment to form an artificial stone-like substance.

6. The speaker cabinet as claimed in claim 2, further comprising a silicone ester coating on the exterior surface of the cast hollow body to improve the waterproofing and weather-proofing of said speaker cabinet.

7. The water-proof, simulated rock speaker cabinet as claimed in claim 1, wherein said speakers further comprise sponge surrounds mounted to the cast hollow body at said well with a water-proof speaker cement.

8. The water-proof simulated rock speaker cabinet as claimed in claim 7, wherein said speaker include peripheral rims and said cabinet further comprises a Hydrostone gasket molded over the rims of the speakers and between the speakers and the speaker grills formed by the pattern of small diameter holes within said body opening to said wells receiving said speakers.

9. The water-proof simulated rock speaker cabinet as claimed in claim 8, wherein an automotive undercoat material is spray coated over the complete interior of the speaker cabinet chamber including said wells and the speakers mounted therein.

10. The water-proof simulated rock speaker cabinet as claimed in claim 1, further comprising a layer of Hydrostone extending over the exterior surface of the plug and bonded to the sides of the speaker cabinet at said opening within the base thereof to seal off said chamber from the exterior of the speaker cabinet at said base opening.

* * * * *

UNITED STATES PATENT AND TRADEMARK OFFICE

CERTIFICATE OF CORRECTION

PATENT NO. : 4,754,852

DATED : July 5, 1988

INVENTOR(S) : Mulé et al

It is certified that error appears in the above-identified patent and that said Letters Patent is hereby corrected as shown below:

Title page:

--[76] Inventors: Anthony F. Mulé, 708 Meadow Rd., Smithtown, N.Y. 11787; Bruce R. Marcel, 43 Harbor North, Amityville, N.Y. 11701; Thomas S. Maxey, 11 Cambridge Ave., Bethpage, N.Y. 11714--

Signed and Sealed this

Fifteenth Day of November, 1988

Attest:

DONALD J. QUIGG

*Attesting Officer*

*Commissioner of Patents and Trademarks*